(12) United States Patent
Elkouby et al.

(10) Patent No.: US 8,545,997 B2
(45) Date of Patent: Oct. 1, 2013

(54) COATED CUTTING TOOL

(75) Inventors: Marcel Elkouby, Haifa (IL); Ram Greenwald, Karmiel (IL); Oren Etziony, Doar Na Oshrat (IL)

(73) Assignee: Iscar, Ltd., Tefen (IL)

( * ) Notice: Subject to any disclaimer, the term of this patent is extended or adjusted under 35 U.S.C. 154(b) by 93 days.

(21) Appl. No.: 12/983,689

(22) Filed: Jan. 3, 2011

(65) Prior Publication Data
US 2011/0171444 A1 Jul. 14, 2011

(30) Foreign Application Priority Data
Jan. 11, 2010 (IL) .......................................... 203242

(51) Int. Cl.
*B32B 9/00* (2006.01)
(52) U.S. Cl.
USPC ............... 428/697; 51/307; 51/309; 428/216; 428/336; 428/469; 428/472; 428/698; 428/699
(58) Field of Classification Search
USPC .................. 51/307, 309; 428/216, 336, 469, 428/472, 697, 698, 699
See application file for complete search history.

(56) References Cited

U.S. PATENT DOCUMENTS

| | | | | |
|---|---|---|---|---|
| 6,824,601 B2 * | 11/2004 | Yamamoto et al. | ........... | 428/699 |
| 7,537,822 B2 * | 5/2009 | Ishikawa | ...................... | 428/697 |
| 7,763,366 B2 * | 7/2010 | Yamamoto et al. | ........... | 428/697 |
| 8,227,098 B2 * | 7/2012 | Åstrand | ........................ | 428/336 |

| | | |
|---|---|---|
| 2005/0186448 A1 | 8/2005 | Yamamoto et al. |
| 2006/0269788 A1 | 11/2006 | Ishikawa |
| 2007/0184306 A1 | 8/2007 | Yamamoto et al. |

FOREIGN PATENT DOCUMENTS

| | | |
|---|---|---|
| CN | 101407905 | 4/2009 |
| EP | 1 726 686 A1 | 11/2006 |
| EP | 1 939 327 A1 | 7/2008 |
| JP | 2002-337002 | 11/2002 |
| JP | 2008-240079 A | 10/2008 |
| JP | 2008 240079 A | 10/2008 |

OTHER PUBLICATIONS

Ichijo et al "Microstructures of (Ti,Cr,Al,Si)N films synthesized by cathodic arc method" Surface & Coatings Techn 201 (2007) p. 5477-5480.*
Veprak et al "Avoiding the high-temperature decomposition and softening of (Al(1-x)Ti(x))N coating by the formation of the stable superhard nc-(Al(1-x)Ti(x))N coatings by the formation of stable superhard nc-(Al(1-x)Ti(x))N/a-Si(3)N(4) nanocomposite" Materials Science & Engineering A366 (2004) p. 202-205.*
Yamamoto et al "Structural and mechanical property of Si incorporated (Ti,Cr,Al)N coatings depostied by arc ion plating process" Surface & Coatings Technology 200 (2005) p. 1383-1390.*
Ezura et al "Micro-hardness, microstructures and thermal stability of (Ti,Cr,Al,Si)N films by cathodic arc method" Vacuum 82 (2008) p. 476-481.*

(Continued)

*Primary Examiner* — Archene Turner
(74) *Attorney, Agent, or Firm* — Womble Carlyle

(57) ABSTRACT

A coated cutting tool has a substrate and a coating. The coating includes at least one multi-nano-layer having a nanocomposite nano-layer formed of crystalline $(Ti_xAl_yCr_z)N$ and amorphous $Si_3N_4$, wherein $0.25 \le x \le 0.75$, $0.25 \le y \le 0.75$, $0.05 \le z \le 0.2$, $0.85 \le x+y+z \le 0.97$. The atomic ratio of silicon is $1-x-y-z$ and $1-x-z<0.75$ and the thickness of the nanocomposite nano-layer is from 1 nm to 100 nm.

22 Claims, 6 Drawing Sheets

(56) References Cited

OTHER PUBLICATIONS

International Search Report dated Apr. 20, 2011 issued in corresponding International Application No. PCT/IL2010/001054.

Veprek et al, "Different approaches to superhard coatings and nanocomposites" *Thin Solid Films*, vol. 476 (2005) pp. 1-29.

Official Action dated Dec. 6, 2012 issued in Israeli counterpart application (No. 20342).

* cited by examiner

COATED CUTTING TOOL

FIELD OF THE INVENTION

The present invention relates to cutting tools covered with a coating comprising at least one nano-layer of a nano-composite of crystalline (TiAlCr)N embedded in an amorphous $Si_3N_4$ matrix.

BACKGROUND OF THE INVENTION

New coatings are continuously being developed in order to increase the lifetime of the coated cutting tools, increase machining speeds and to improve the quality of the machined surface. Longer tool life at high cutting speed increases productivity while reducing costs of maintenance and personnel. Use of cutting tools that maintain hardness at high working temperatures with minimum lubricant or for dry machining both reduces costs and is environmentally friendly.

It is known (US 2007/0184306) to coat cutting tools with a hard film composed of $M_{1-a-b}Al_aSi_b(B_xC_yN_{1-x-y})$ where M denotes Ti and Cr. The lower and upper limits of the atomic ratio of Al (a) in this film are 0.05 and 0.5 respectively. This hard coating film has a crystal structure free of hexagonal crystals and/or amorphous phase since, according to the inventors, the presence either the hexagonal phase or the amorphous phase decreases the hardness of the hard coating film.

A cutting tool coated with at least one layer formed out of an amorphous compound phase including Si, and compounded by Ti, Al, Si with relatively rich Si and with at least one type of element selected from the C, N, O, B, and a crystalline compound phase compounded by Ti, Al, Si with relatively poor Si with at least one type of element selected from C, N, O, B is disclosed in JP2002337002.

Two phase nano-composite coatings of at least 1 μm having nano-crystalline (nc) grains of either nc-TiN, nc-$(Al_{1-x}Ti_x)N$, or nc-$(Al_{1-x}Cr_x)N$ that are "glued" together by an amorphous (a) matrix of a-$Si_3N_4$ are known. (Veprek et al. *Thin Solid Films* 476 (2005) 1-29). The Si atoms of the a-$Si_3N_4$ are covalently bonded to the nitrogen showing Si 2p binding energy of 101.7±0.1. The amorphous $Si_3N_4$ matrix has a shear and de-cohesion strength greater than that of bulk $SiN_x$.

One advantage of this coating is the increased hardness having a Vickers hardness $H_V$ of over 40 GPa. The generic concept for the design of superhard and thermally stable nano-composites is based on a thermodynamically driven spinodal phase segregation that results in the formation of a stable nanostructure by self-organization. In order to achieve this during deposition, a sufficiently high-nitrogen activity (partial pressure≥0.02 mbar) at relatively high deposition temperature (500-600° C.) is needed. The nitrogen provides a high thermodynamic driving force and the temperature ensures diffusion-rate controlled phase segregation to proceed sufficiently fast during deposition to obtain the phase segregation. Thermodynamic calculations of the Gibbs free energy of a mixed system of stoichiometric TiN and $Si_3N_4$ show that under the deposition temperature and nitrogen pressure described above, the phase segregation is of a spinodal nature (R. F. Zhang, S. Veprek/*Materials Science and Engineering A* 424 (2006) 128-137 and S. Veprek et al./*Surface & Coatings Technology* 200 3884 (2006) 3876-3885). Thus, the nano-crystalline phase should not have any Si content when deposited at these conditions.

Another advantage in nano-composite coatings of nc-$(Al_{1-x}Ti_x)N/a-Si_3N_4$ is that the thin a-$Si_3N_4$ matrix stabilizes the Al-rich $(Al_{1-x}Ti_x)N$ metastable solid solution against the decomposition into cubic c-TiN and hexagonal h-AlN and concomitant softening of the coating. It is known that $(Al_{1-x}Ti_x)N$ begins to decompose at temperatures of about 700° C. in $(Al_{1-x}Ti_x)N$ coatings that do not contain Si. Nano-composite layers of nc-$(Al_{1-x}Ti_x)N/a-Si_3N_4$ are stable up to 1200° C.

Another important advantage of nano-composites is their high oxidation resistance up to temperatures of more than 800° C. This is related to the dense and strong a-$Si_3N_4$ matrix that hinders the diffusion of oxygen along the grain boundaries. However, different modes of measuring oxidation resistance are used so that it is not easy to compare the published "starting oxidation temperatures" and the temperatures at which the oxidation is critical. For example, in one method (US2007/0184306) the sample was heated in dry air at a rate of 4° C./min and the weight increase due to oxidation was plotted. The temperature at which the sample began to increase in weight was regarded as the oxidation starting temperature. Another method (Veprek et at *Surface & Coatings Technology* 202 (2008) 2063-5073) is to compare the thickness of the oxide formed on a nano-composite coating and on another coating, for example TiAlN, after one hour in air at a given temperature, for example 900° C. Another method, similar to the first, takes the temperature at which the oxide can first be seen at high magnification (of about 1000×) as the oxidation starting temperature.

A known multilayer coating is of a nano-composite AlCrSiN top layer that is 0.75-1.5 μm thick on a more ductile and softer underlayer of TiAlN that is 3-5 μm thick. (S. Veprek et al, *Surface & Coatings Technology* 202 (2008) 2063-2073). The method of deposition uses vacuum arc coating technology with planar cathodes. Another method of deposition uses vacuum arc coating technology for an nc-(TiAl)N/a-$Si_3N_4$ nano-composite. In this method rotating cathodes placed either in the center of the coating chamber or in its door. Other known methods of deposition include unbalanced magnetron sputtering.

CN101407905 discloses a coated cemented carbide cutting tool the coating comprising a composite mixed crystal structural layer containing a layer of a nano crystalline/amorphous composition made up of TiAlMSiN deposited on a titanium based binding layer. M is one or more of metal elements of Ta, Nb, Zr, Cr, Hf, and W. The thickness of the TiAlMSiN layer is at least 0.5 μm.

A known disadvantage of nano-composite coatings is that impurities for example oxygen, even at levels of a few hundred ppm, lead to a very strong degradation of the maximum achievable hardness.

Another disadvantage is a limitation of nano-composite layer thickness. These layers are known to have high compressive stresses and therefore have a tendency to flake if they are thicker than about 3 μm.

Another disadvantage of nano-composite coatings with enhanced hardness is relatively low toughness (*Plasma Process. Polym.* 2007, 4 219-228 Zhang et. al.). Toughness is the ability of a material to absorb energy during deformation up to fracture. In order to obtain high hardness in nano-composite coatings, usually plastic deformation is designed to be prohibited, and grain boundary and sliding are prevented, thus causing a loss of ductility. Ductility is related to toughness, which is very important for hard coatings to avoid catastrophic failure.

SUMMARY OF THE INVENTION

In accordance with an aspect of the present invention there is provided a coated cutting tool comprising a substrate and a coating. The coating comprises at least one multi-nano-layer comprising nano-composite nano-layers. The nano-composite nano-layers consisting of crystalline $(Ti_xAl_yCr_z)N$ embedded in an amorphous $Si_3N_4$ matrix. The atomic ratios of the components of the formula are $0.25 \leq x \leq 0.75$, $0.25 \leq y \leq 0.75$, $0.05 \leq z \leq 0.2$, $0.85 \leq x+y+z \leq 0.97$, wherein the atomic ratio of silicon is $1-x-y-z$ and $1-x-z<0.75$. The thickness of the nano-composite nano-layer is from 1 nm to 100 nm.

Typically, the multi-nano-layer further comprises a second nano-layer, the second nano-layer comprises a metallic or ceramic material. The metallic material is one or more metals selected from the group consisting of Ti, Zr, Hf, V, Nb, Ta, Cr, Mo, W, Al, Y and Ru. The ceramic material is: (1) one or more of a nitride, carbide, boride or oxide of one or more elements selected from the group consisting of Ti, Zr, Hf, V, Nb, Ta, Cr, Mo, W, Al, Si, Y and Ru, (2) diamond, or (3) BN. The second nano-layer is crystalline and the thickness of the second nano-layer is from 1 nm to 100 nm.

In some embodiments, the second nano-layer comprises $(Ti_aAl_bMe_{1-a-b})(C_vN_{1-v})$ wherein $0 \leq a \leq 1$, $0 \leq b < 0.75$, and wherein Me is a metal selected from the group consisting of Cr, Mo, V, Nb, Ta, Zr, Hf, Y, and Ru wherein $0 \leq v \leq 1$.

In some embodiments, the multi-nano-layer comprises at least two nano-composite nano-layers of different compositions.

In accordance with some embodiments, the multi-nano-layer comprises at least two second nano-layers of different compositions.

In accordance with some embodiments, the multi-nano-layer consists of nano-composite nano-layers that are alternately stacked with the second nano-layers. In some embodiments, the multi-nano-layer comprises two or more second nano-layers between sequential nano-composite nano-layers.

Optionally the multi-nano-layer comprises 50 to 300 nano-composite nano-layers.

In accordance with some embodiments, the coating further comprises at least one intermediate layer between the substrate and the multi-nano-layer. The intermediate layer is one or more of a boride, nitride, carbide, or oxide of one or more elements selected from the group consisting of Ti, Zr, Hf, V, Nb, Ta, Cr, Mo, W, Al, Si, Y and Ru. The thickness of the at least one intermediate layer is from 0.5 μm to 10 μm. In some embodiments, the at least one intermediate layer comprises $(Ti_aAl_bMe_{1-a-b})(C_vN_{1-v})$ wherein $0 \leq a \leq 1$, $0 \leq b \leq 0.75$ and $0 \leq v \leq 1$; wherein Me is a metal selected from the group consisting of Cr, Mo, V, Nb, Ta, Zr, Hf, Y, and Ru.

In another aspect of the invention, the coating further comprises an adhesion layer between the substrate and the intermediate layer. The composition of the adhesion layer is different from the composition of intermediate layer. The adhesion layer comprises at least one layer of $(Me_wAl_{1-w})N$ wherein $0.5 \leq w \leq 1$ and wherein M is titanium and/or chromium. The thickness of the adhesion layer is from 0.1 μm to 2 μm.

Optionally the intermediate layer is at least two sublayers differing in composition, the thickness of each of the sublayers is from 1 nm to 500 nm.

In another aspect of the invention, the coating comprises more than one multi-nano-layer and further comprises at least one auxiliary layer between the multi-nano-layers. The at least one auxiliary layer comprises a metallic or ceramic material. The metallic material consists of one or more metals selected from the group consisting of Ti, Zr, Hf, V, Nb, Ta, Cr, Mo, W, Al, Y and Ru. The ceramic material is selected from the group consisting of (1) one or more of a boride, carbide, nitride, or oxide of one or more elements selected from the group consisting of Ti, Zr, Hf, V, Nb, Ta, Cr, Mo, W, Al, Si, Y and Ru, (2) diamond, (3) diamond-like-carbon, and (4) BN.

Optionally the outermost layer of the coating comprises the multi-nano layer.

In some embodiments, the coated cutting tool further comprises a top layer that is the outermost layer of the coating. The top layer is a metallic or ceramic material; wherein the metallic material comprises one or more metals selected from the group consisting of Ti, Zr, Hf, V, Nb, Ta, Cr, Mo, W, Al, Y and Ru; and wherein the ceramic material is selected from the group consisting of: (1) one or more of a boride, carbide, nitride, or oxide of one or more elements selected from the group consisting of Ti, Zr, Hf, V, Nb, Ta, Cr, Mo, W, Al, Si, Y and Ru, (2) diamond, (3) diamond-like-carbon, and (4) BN.

Typically, the substrate is selected from the group consisting of: high speed steel, hard metals, oxide ceramics, carbide ceramics, boride ceramics, super abrasive materials, PcBN, PCD, and cermets, or combinations thereof.

In another aspect of the invention, there is provided a method of making a coated cutting tool comprising a substrate and a coating, the coating comprising at least one multi-nano-layer, the method comprising the steps of:

a) depositing a nano-composite nano-layer over the substrate, the nano-composite nano-layer consisting of crystalline $(Ti_xAl_yCr_z)N$ embedded in an amorphous $Si_3N_4$ matrix; wherein $0.25 \leq x \leq 0.75$, $0.25 \leq y < 0.75$, $0.05 \leq z \leq 0.2$, $0.85 \leq x+y+z \leq 0.97$, wherein the atomic ratio of silicon is $1-x-y-z$ and wherein the thickness of the nano-composite nano-layer is from 1 nm to 100 nm;

b) depositing at least one second nano-layer over the nano-composite nano-layer, the second nano-layer is crystalline and has a thickness of from 1 nm to 100 nm. The second nano-layer comprises (a1) a metallic material consisting of one or more metals selected from the group consisting of Ti, Zr, Hf, V, Nb, Ta, Cr, Mo, W, Al, Y and Ru; or (a2) a ceramic material comprising: (a21) one or more of a boride, carbide, nitride, or oxide of one or more elements selected from the group consisting of Ti, Zr, Hf, V, Nb, Ta, Cr, Mo, W, Al, Si, Y and Ru; (a22) diamond, or (a23) BN; and c) alternatingly performing step a and step b 50 to 300 times.

Typically, the coating is deposited with a PVD technique at a deposition temperature of more than 500° C. under a nitrogen partial pressure of at least 0.02 mbar.

Optionally the method further comprises one or more steps of:

i) depositing an adhesion layer over the substrate, prior to performing step a) wherein the adhesion layer comprises at least one layer of $(Me_wAl_{1-w})N$ wherein $0.5 \leq w \leq 1$ and wherein M is titanium and/or chromium; and a thickness of the adhesion layer is from 0.1 μm to 2 μm; and ii) depositing at least one intermediate layer over the adhesion layer, the intermediate layer comprising one or more of a boride, nitride, carbide, or oxide of one or more elements selected from the group consisting of Ti, Zr, Hf, V, Nb, Ta, Cr, Mo, W, Al, Si, Y and Ru. In some embodiments of the invention the intermediate layer comprises $(Ti_aAl_bMe_{1-a-b})(C_vN_{1-v})$ wherein $0 \leq a \leq 1$, $0 \leq b < 0.75$ and $0 \leq v \leq 1$, Me is a metal selected from the group consisting of Cr, Mo, V, Nb, Ta, Zr, Hf, Y, and Ru; and a thickness of the intermediate layer is from 0.5 μm to 10 μm.

In accordance with some embodiments, the method further comprises the step of:

d) treating the coated cutting tool in a protective atmosphere of nitrogen at a temperature of from 400° C. to 1100° C. for a duration of from 20 minutes to 180 minutes.

Optionally, the coating comprises more than one multi-nano-layer the method further comprising the steps of:

e) depositing at least one auxiliary layer over the multi-nano-layer; the at least one auxiliary layer comprising (e1) a metallic material consisting of one or more metals selected from the group consisting of Ti, Zr, Hf, V, Nb, Ta, Cr, Mo, W, Al, Y and Ru; or (e2) a ceramic material selected from the group consisting of: (e21) one or more of a boride, carbide, nitride, or oxide of one or more elements selected from the group consisting of Ti, Zr, Hf, V, Nb, Ta, Cr, Mo, W, Al, Si, Y and Ru; (e22) diamond, (e23) diamond-like-carbon, and (e24) BN;

f) performing steps a-c; and g) alternatingly performing step e and step f at least one time.

BRIEF DESCRIPTION OF THE FIGURES

For a better understanding of the invention and to show how it may be carried into effect, reference will now be made, purely by way of example, to the accompanying drawings.

Figure 1A:
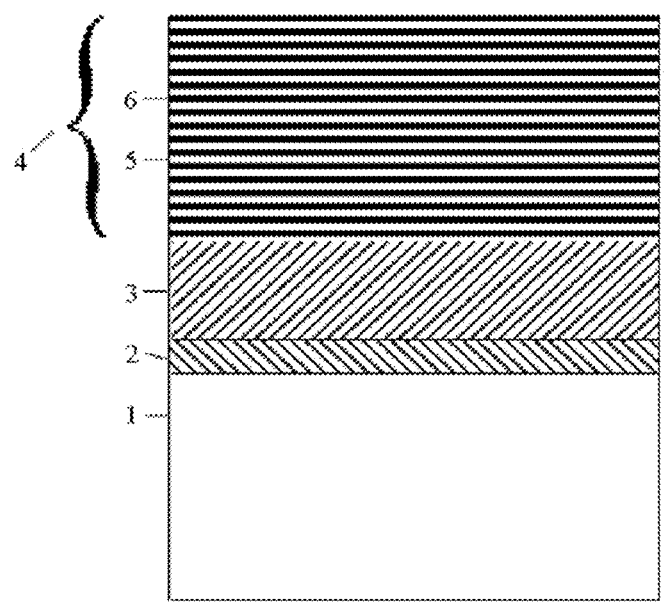
FIG. 1A is a schematic cross-section of the coating layers of a cutting tool in accordance with an embodiment of the invention.

With specific reference now to the drawing in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. The description taken with the drawings making apparent to those skilled in the art how the several forms of the invention may be embodied in practice.

DETAILED DESCRIPTION OF THE INVENTION

The present invention is a cutting tool coated with a coating comprising a multi-nano-layer having nano-composite nano-layers.

The cutting tool may be a one-piece solid cutting tool, a cutting tool consisting of an insert holder and a cutting insert secured therein, an insert holder, or a cutting insert.

A substrate of the cutting tool may be made a hard metal, high speed steel, oxide, carbide or boride ceramics, a super abrasive, PcBN, PCD, or a cermet substrate or combinations thereof.

Figure 2:
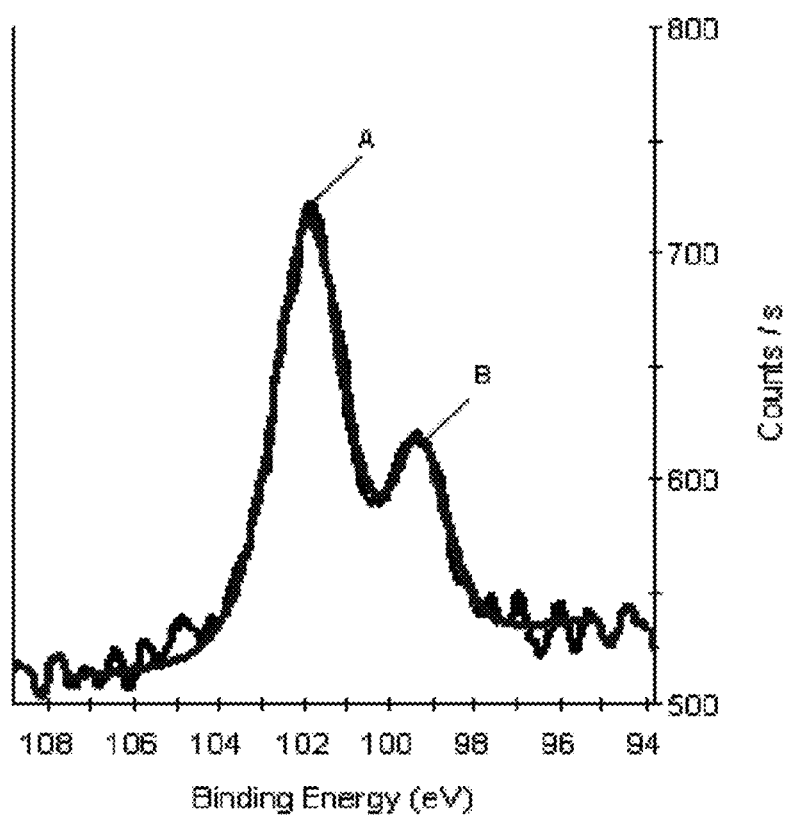
FIG. 2 is a XPS (x-ray photoelectron spectroscopy) of a nano-composite layer in accordance with an embodiment of the invention.

The nano-composite nano-layers of the multi-nano-layer of the coating have a nano-crystalline phase of nc-$(Ti_xAl_yCr_z)N$ embedded in an amorphous matrix of a-$Si_3N_4$. The atomic ratios of the components of the nano-crystalline phase are $0.25 \leq x \leq 0.75$, $0.25 \leq y < 0.75$, $0.05 \leq z \leq 0.2$, $0.85 \leq x+y+z \leq 0.97$. The atomic ratio of silicon from the metallic elements of the nano-composite is $1-x-y-z$. The nano-composite nano-layer has a thickness of from about 1 nm to about 100 nm. The nano-composite nano-layers are deposited at a deposition temperature between 500° C. and 600° C. and under a nitrogen partial pressure of at least 0.02 mbar. These deposition conditions are known to bring about a thermodynamically driven spinodal phase segregation that results in the formation of a stable nanostructure by self-organization FIG. 2 is an X-ray photoelectron spectroscopy (XPS) graph of the nano-composite nano-layer in accordance with an embodiment of the invention. For XPS analysis, the samples were irradiated with monochromatic X-rays (the X-ray source used was Al Kα, 1486.6 eV). Prior to analysis, the samples were sputtered by Ar ion sputtering up to the nano-composite nano-layer. Survey spectra were recorded with a pass energy of 100 eV, from which the surface chemical composition was determined. Spectra were acquired in the standard (take-off angle of 53±30°) mode of operation and are plotted as the number of electrons measured as a function of binding energy. FIG. 2 shows two peaks: a high binding energy line (Peak A) at 101.66 eV and a lower binding energy line (Peak B) at 99.40 eV. Peak A is related to Si—N bonds that correspond to $Si_3N_4$. Peak B is more difficult to interpret. It could be assigned to the Al KLL Auger signal whose position overlaps with the Si 2p signal from $TiSi_2$ (as suggested by Veprek in, *Towards the Industrialization of Superhard Nanocrystalline Composites for High Speed and Dry Machining*), Si—Si bonds, or Si bonded to one of metals Al, Cr or/and Ti (for example $TiSi_2$), or alternatively could be metallic bonds formed at the grain boundaries of the amorphous $Si_3N_4$ with the crystalline (TiAlCr)N. The inventors hypothesize that Peak B either is a result of the Al KLL Auger signal or alternatively shows metallic bonds formed at the grain boundaries.

Figure 3:
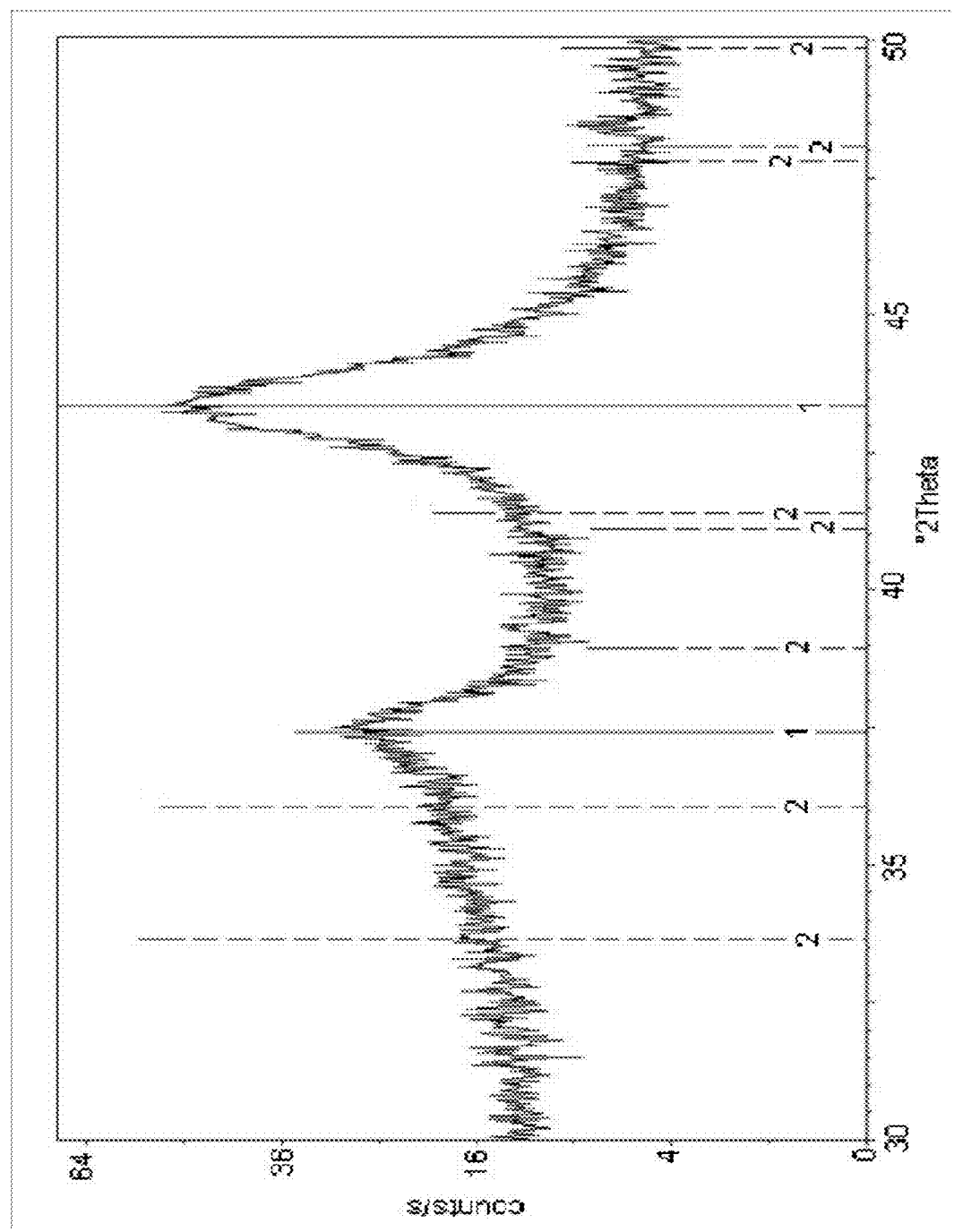
FIG. 3 is an XRD of a nano-composite layer in accordance with an embodiment of the invention.

FIG. 3 is an XRD spectrum of the nano-composite nano-layer obtained at a glazing angle in accordance with an embodiment of the invention. The lines numbered 1 are the peaks of cubic AlTiCrN. The lines numbered 2 are where peaks of crystalline $Si_3N_4$ reference pattern 33-1160 appear. As can be seen in FIG. 3, the only crystalline phase present in the nano-composite layer is a cubic phase and there is no hexagonal phase or trigonal phase or any crystalline $Si_3N_4$ phase.

Putting together the data from FIG. 2 and FIG. 3, the inventors conclude that the nano-composite nano-layer has a cubic (TiAlCr)N phase and an amorphous $Si_3N_4$ phase.

Figure 4:
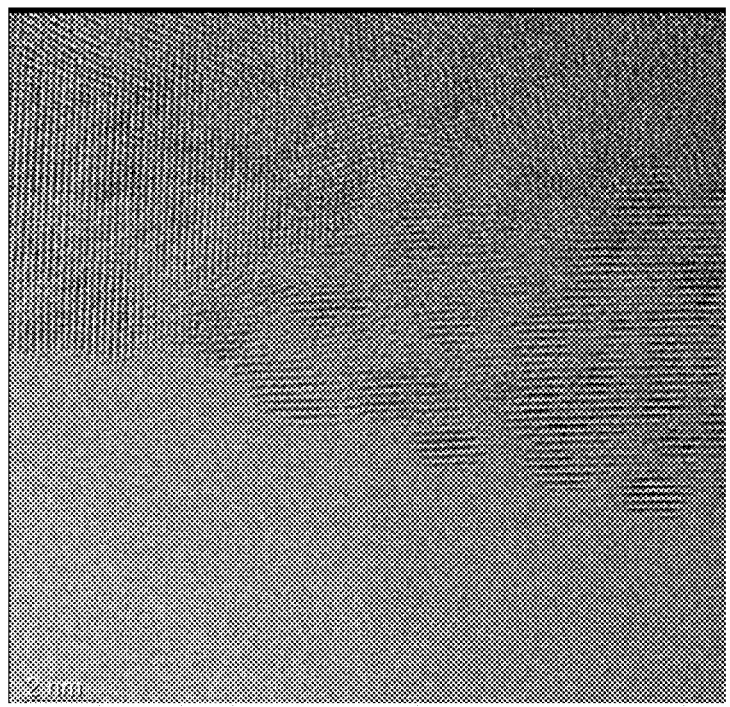
FIG. 4 is a photomicrograph (with a 2 nm scale) taken via transmission electron microscopy (TEM) of the nano-composite layer in accordance with an embodiment of the invention
Figure 5:
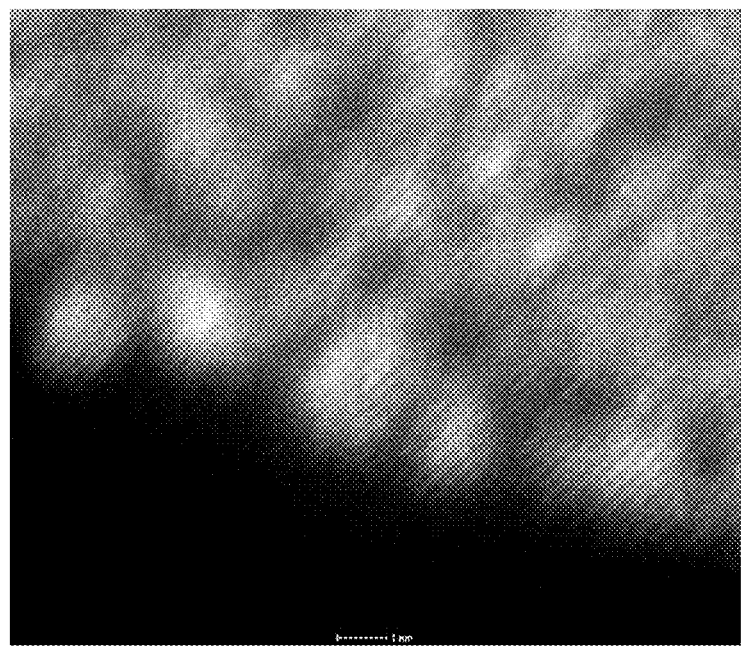
FIG. 5 is a photomicrograph (with a 1 nm scale) taken via scanning transmission electron microscopy (STEM) of the nano-composite layer in accordance with an embodiment of the invention

FIGS. 4 and 5 show photomicrographs taken of the nano-composite layer via transmission electron microscopy (TEM) with a 2 nm scale and via scanning transmission electron microscopy (STEM) with a 1 nm scale respectively. The TEM photomicrograph of FIG. 4 shows a nano-composite structure of ordered crystalline grains and areas that are amorphous. With the STEM and a high-angle detector, it is possible to form atomic resolution images where the contrast is directly related to the atomic number. Thus the STEM photomicrograph of FIG. 5. shows a nano-composite structure of bright areas that have a greater atomic number than the dark areas.

The bright areas correspond to the nc-$(Ti_xAl_yCr_z)N$ grains and the dark areas surrounding the bright areas correspond to the lighter $Si_3N_4$ matrix.

The nano-crystalline grains are nc-$(Ti_xAl_yCr_z)N$ ($0.85 \leq x+y+z \leq 0.97$) which are surrounded by an a-$Si_3N_4$ matrix. The atomic ratio of titanium in nano-composite nano-layer is $0.25 \leq x \leq 0.75$. The atomic ratio of chromium is $0.05 \leq z \leq 0.2$ for increasing oxidation resistance and fracture toughness. The atomic ratio of aluminum in the nano-composite nano-layer is $0.25 \leq y < 0.72$. It is known that a hexagonal phase of AlN will form when the sum of the atomic ratios of aluminum and silicon is over 0.75. The atomic ratio of silicon in the metallic elements of the nano-composite nano-layer is $0.03 \leq 1-x-y-z \leq 0.15$ and $1-x-z < 0.75$. Coatings comprising the nano-composite nano-layer have high temperature resistance and high hardness even at elevated temperatures.

FIG. 1A shows a schematic illustration of an embodiment of the invention of a cutting tool with a substrate 1 coated with a multi-nano-layer 4. Nano-composite nano-layers 5 are alternated with crystalline nano-layers 6 to form a multi-nano-layer 4. The crystalline nano-layers 6 comprise a metallic or ceramic material. The metallic material is one or more metals selected from the group consisting of Ti, Zr, Hf, V, Nb, Ta, Cr, Mo, W, Al, Y and Ru. The ceramic material comprises a boride, a carbide, a nitride, an oxide, or any combination thereof, of one or more elements selected from the group consisting of Ti, Zr, Hf, V, Nb, Ta, Cr, Mo, W, Al, Si, Y and Ru. In some embodiments, the ceramic material may be diamond or BN. The composition of the crystalline nano-layer is different from the composition of the nano-composite nano-layer. In some embodiments of the invention, there are two or more crystalline nano-layers 6 between sequential nano-composite nano-layers 5. Some examples of crystalline nano-layers 6 that improve cohesiveness are of the formula $(Ti_aAl_bMe_{1-a-b})(C_vN_{1-v})$ wherein Me is a metal selected from the group consisting of Cr, Mo, V, Nb, Ta, Zr, Hf, Y, and Ru wherein $0 \leq v \leq 1$. The atomic ratio of titanium in the crystalline nano-layers 6 is $0 \leq a \leq 1$. The atomic ratio of aluminum in the crystalline nano-layers 6 is $0 \leq b < 0.75$.

Both the nano-composite nano-layers and the crystalline nano-layers may have a thickness in the range of from about 1 nm to about 100 nm. The multi-nano-layer has from about 50 to about 300 nano-composite nano-layers.

The multi-nano-layer effectively combines the advantages of the hard nano-composite nano-layer and the crystalline nano-layer. One benefit is that crack absorption is improved, leading to increased toughness of the coating. For coatings for metal machining applications, high hardness is not useful without toughness and both qualities are important in many applications for cutting tools. The multi-nano-layer according to the present invention may have crystalline nano-layers of one or more of the compositions defined above leading to varied characteristic properties of the coating as required by different applications.

Another advantage of the present invention is that the thickness of the coating may be thicker than 3 μm without flaking. This is due to both the multi-nano-layer structure and to the presence of crystalline nano-layers having a lower compressive stress than the nano-composite nano-layers.

Tool life is related to cutting speed, dimensions of the cut, tool angles, tool shape, coolant, chatter, etc. Cutting speed is the variable having by far the greatest influence on tool life. Higher heat resistance of the coating results in faster RPM without damaging the cutting tool. The coatings of the invention maintain the higher working temperature and oxidation resistance of known nano-composite coatings even though the multi-nano-layer of these coatings incorporate crystalline nano-layers that altogether amount to more or less half of the multi-nano-layer. The maximum working temperature for TiCN is about 550° C., of TiAlN is about 800° C. as compared with a maximum working temperature of the invention being about 1100° C.

In some embodiments of the invention, there is an intermediate layer 3 between the multi-nano-layer and the substrate 1 as shown in FIG. 1A, which imparts toughness to the coating. The intermediate layer 3 is a ceramic layer that may be a boride, a nitride, a carbide, an oxide, or any combination thereof of one or more elements selected from the group consisting of Ti, Zr, Hf, V, Nb, Ta, Cr, Mo, W, Al, Si, Y and Ru. In some embodiments of the invention, the intermediate layer 3 comprises $(Ti_aAl_bMe_{1-a-b})(C_vN_{1-v})$ wherein Me is a metal selected from the group consisting of Cr, Mo, V, Nb, Ta, Zr, Hf, Y, and Ru wherein $0 \leq v \leq 1$. The atomic ratio of titanium in the intermediate layer 3 is $0 \leq a \leq 1$. The atomic ratio of aluminum in the intermediate layer 3 is $0 \leq b < 0.75$. The intermediate layer 3 has a thickness of from about 0.5 μm to about 10 μm.

In some embodiments of the invention, there is an adhesion layer 2 between the intermediate layer and the substrate, as shown in FIG. 1A, which has a thickness of from about 0.1 μm to about 2 μm. The adhesion layer is of the formula $(M_wAl_{1-w}N$ ($0.5 \leq w \leq 1$) wherein M is titanium and/or chromium.

Figure 1B:
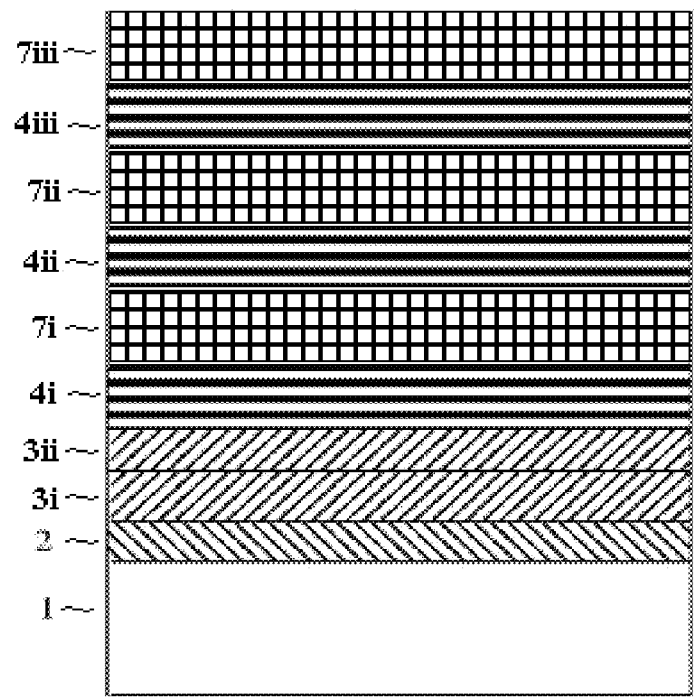
FIG. 1B is a schematic cross-section of the coating layers of a cutting tool in accordance with an embodiment of the invention, showing sublayers.

FIG. 1B shows a schematic illustration of another embodiment of the invention of a cutting tool with a substrate 1 coated with three multi-nano-layers 4i, 4ii, 4iii alternating with auxiliary layers 7i and 7ii. The auxiliary layer may be a metallic layer of one or metals selected from Ti, Zr, Hf, V, Nb, Ta, Cr, Mo, W, Al, Y and Ru. In other embodiments the auxiliary layer may be a boride, carbide, nitride, oxide, or any combination thereof of one or more elements selected from Ti, Zr, Hf, V, Nb, Ta, Cr, Mo, W, Al, Si, Y and Ru. Alternatively, the auxiliary layer may comprise diamond-like-carbon, diamond, or boron nitride. The outermost layer of the coating may be the multi-nano-layer, as shown in FIG. 1A, or the auxiliary layer 7iii, as shown in FIG. 1B. Auxiliary layers 7i, 7ii, 7iii etc., may all comprise a similar composition or, alternatively, one or more auxiliary layer may vary in composition.

In some embodiments of the invention, the coating may have either two multi-nano-layers or more than three multi-nano-layers. In some embodiments, there are two or more auxiliary layers between sequential multi-nano-layers. In some embodiments of the invention the intermediate layer comprises at least two intermediate sublayers 3i, 3ii differing in composition as shown in FIG. 1B.

The cutting tools may optionally undergo a post coating thermal treatment in a protective atmosphere against oxidation such as nitrogen. The temperature of the thermal treatment is between 400° C. and 1100° C. preferably between 700° C. and 900° C. The duration of the heat treatment is between 30 minutes and 180 minutes. This treatment further stabilizes and toughens the spinodal phase segregation of the nano-composite nano-layers.

Many factors contribute to extending the lifetime of coated cutting tools especially when machining under challenging conditions such as quicker machining speeds or low machinability workpieces. Some of these factors are high wear resistance, elevated cutting temperatures, impact resistance, adherence of the coating to the substrate, and toughness. Various criteria have been used to show improved coatings such as hardness, working temperature, and amount of wear. These will be shown in the following examples.

EXAMPLE 1

By way of proof of concept, with reference to FIG. 1A, the substrate (1) of the cutting tool is of hard metal and the coating is deposited by a PVD method.

Coating on cemented carbide was carried out in the following manner by using the known method of vacuum arc coating technology with round planar cathodes.

First, the cathodes of the coating apparatus were provided with targets of TiAl, AlTi, and AlTiCrSi and with the substrates of milling inserts of cemented carbide, end mills of cemented carbide, and turning inserts of cemented carbide.

With the vacuum chamber of the coating apparatus evacuated, the substrates were heated to a high deposition temperature of more than 500° C. by a heater therein, and the vacuum chamber was fed with nitrogen gas. With the high pressure in the vacuum chamber kept at more than 4 Pa, arc discharging was started to form an adhesion layer of TiAlN (0.5 μm thick) on the surface of the substrate. The intermediate layer of AlTiN (2.5 μm thick) was then deposited onto the adhesion layer. The multi-nano-layer coating of alternating nano-layers of (1) nano-composite nano-layers and (2) crystalline nano-layers of TiAlN were then deposited by evaporating the targets of TiAl and AlTiCrSi respectively. A bias voltage of −30 V to −300 V was applied to the substrate so that the substrate remained at a minus potential with respect to the earth potential during the coating process. The nano-layers are all about 6 nm thick.

The coated cutting tools the underwent a heat treatment at a temperature of more than 400 and up to 800° C. in a protective nitrogen atmosphere for at least 30 and up to 120 minutes. The cutting tools were then cooled gradually to room temperature in the protective nitrogen atmosphere. Hereinafter this coating will be referred to as Sample 1. The compositions of the layers of Sample 1 are in Table 1.

TABLE 1

| Layer | Composition of coating film (atomic ratio) | | | | | | Structure | Coating | Working |
| --- | --- | --- | --- | --- | --- | --- | --- | --- | --- |
| | Al | Ti | Cr | Si | Al + Si | N | Type* | thickness [μm] | temp. [° c.] |
| Adhesion | 0.50 | 0.50 | 0 | 0 | 0.50 | 1 | c | 0.5 | 1100 |
| Intermediate | 0.65 | 0.35 | 0 | 0 | 0.65 | 1 | c | 2.5 | |
| Multi-nano | 0.42 | 0.42 | 0.1 | 0.06 | 0.48 | 1 | c + a | 1.5 | |

(*c is a crystalline structure and a is an amorphous structure)

EXAMPLE 2

Comparative coatings were prepared on the same substrates and under the same conditions as described in Example 1. Comparative Sample 2 is a monolayer of TiAlN having a thickness of about 4 μm. Comparative Sample 3 is a layer of (Ti,Al,Si)N having a thickness of about 4 μm. Comparative Sample 4 is a nano-composite monolayer of a (Al,Ti,Cr,Si)N having a thickness of about 4.5 μm. Samples 2-4 were analyzed and the results are in Table 2.

TABLE 2

| Comparative Sample # | Composition of coating film (atomic ratio) | | | | | | | Structure Type* | Coating thickness [μm] | Working temp. [° c.] |
| --- | --- | --- | --- | --- | --- | --- | --- | --- | --- | --- |
| | Al | Ti | Cr | Si | Al + Si | C | N | | | |
| Sample 2 | 0.48 | 0.52 | 0 | 0 | 0.48 | 0 | 1 | c | 4 | 850 |
| Sample 3 | 0.42 | 0.54 | 0 | 0.04 | 0.46 | 0 | 1 | c + a | 4 | 950 |
| Sample 4 | 0.39 | 0.30 | 0.19 | 0.12 | 0.51 | 0 | 1 | c + a | 4.5 | 1010 |

(*c is a crystalline structure and a is an amorphous structure)

EXAMPLE 3

Figure 6:
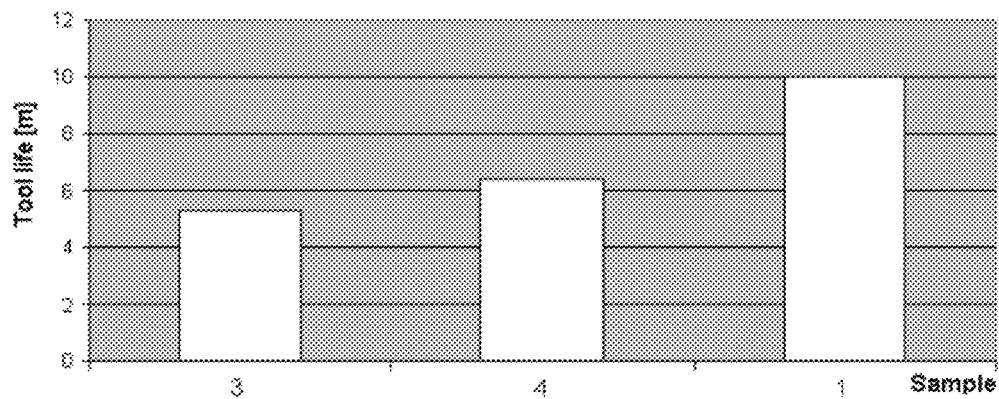
FIG. 6 is a graph that shows an increased tool life of a cutting tool coated in accordance with an embodiment of the invention in a milling application.
Figure 7:
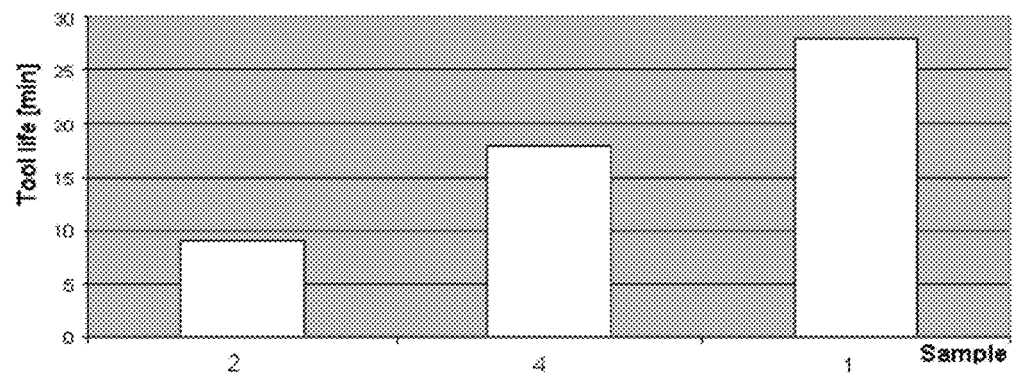
FIG. 7 is a graph that shows an increased tool life of a cutting tool coated in accordance with an embodiment of the invention in a turning application.
Figure 8:
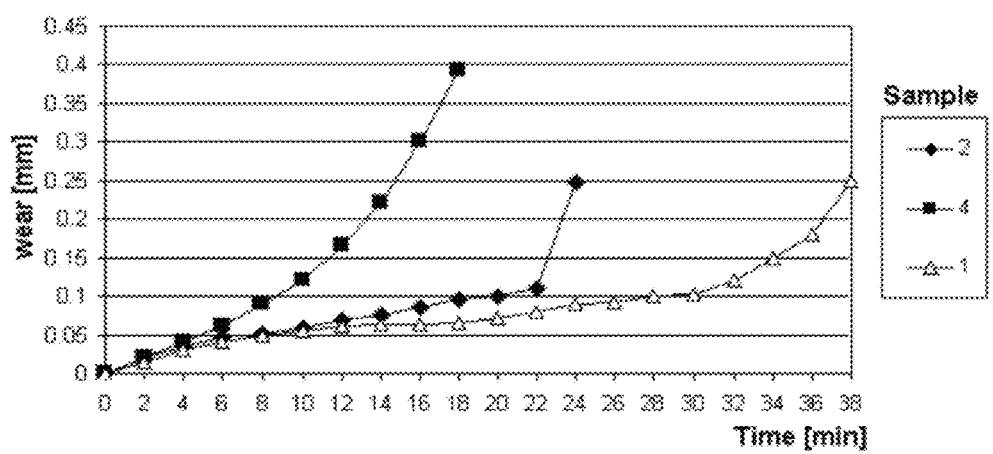
FIG. 8 is a graph that shows an increased tool life of a cutting tool coated in accordance with an embodiment of the invention in a milling application.

The tool life of Samples 1-4 was tested and compared. The cutting data is shown in Table 3. FIG. 6 compares Sample 1, Sample 3 and 4 for a face milling application of stainless steel. FIG. 7 compares Sample 1 and Sample 2 and Sample 4 for a turning application of Inconel. FIG. 8 compares Sample 1, Sample 2 and Sample 4 for a milling application of hard steel. In all of these applications Sample 1 shows significantly improved results.

TABLE 3

| FIGURE | Samples | Cutting speed. Vc [m/min] | Feed Fz [mm/t] | Depth of cut Ap [mm] | Workpiece | Coolant |
| --- | --- | --- | --- | --- | --- | --- |
| 6 | 1, 3, 4 | 100-200 | 0.12 | 4 | Stainless steel | — |
| 7 | 1, 2, 4 | 30-60 | 0.15 | 0.5 | Inconel | yes |
| 8 | 1, 2, 4 | 150-250 | 0.25 | 0.4 | Hardened steel | air |

Although the present invention has been described to a certain degree of particularity, it should be understood that various alterations and modifications could be made without departing from the scope of the invention as hereinafter claimed.

What is claimed is:

1. A coated cutting tool comprising a substrate and a coating; wherein:

the coating comprises at least one multi-nano-layer, comprising a plurality of nano-composite nano-layers with at least one second nano-layer having a thickness of from 1 nm to 100 nm between the nano-composite nano-layers; wherein:

the second nano-layer is crystalline;

the nano-composite nano-layers consist of crystalline $(Ti_x Al_y Cr_z)N$ embedded in an amorphous $Si_3N_4$ matrix, wherein $0.25 \leq x \leq 0.75$, $0.25 \leq y \leq 0.75$, $0.05 \leq z \leq 0.2$, $0.85 \leq x+y+z \leq 0.97$, and $1-x-z < 0.75$;

the atomic ratio of silicon is 1-x-y-z; and
a thickness of the nano-composite nano-layers is from 1 nm to 100 nm.

2. The coated cutting tool according to claim 1, wherein the multi-nano-layer comprises at least two nano-composite nano-layers of different compositions.

3. The coated cutting tool according to claim 1, wherein: the second nano-layer comprises:
   (a) a metallic material consisting of one or more metals selected from the group consisting of Ti, Zr, Hf, V, Nb, Ta, Cr, Mo, W, Al, Y and Ru; or
   (b) a ceramic material comprising:
   (b1) one or more of a boride, carbide, nitride, or oxide of one or more elements selected from the group consisting of Ti, Zr, Hf, V, Nb, Ta, Cr, Mo, W, Al, Si, Y and Ru,
   (b2) diamond, or
   (b3) BN.

4. The coated cutting tool according to claim 3, wherein:
the second nano-layer comprises $(Ti_aAl_bMe_{1-a-b})(C_vN_{1-v})$, wherein $0 \leq a \leq 1$, $0 \leq b \leq 0.75$, and $0 \leq v \leq 1$; and
Me is a metal selected from the group consisting of Cr, Mo, V, Nb, Ta, Zr, Hf, Y and Ru.

5. The coated cutting tool according to claim 3, wherein the multi-nano-layer comprises at least two second nano-layers of different compositions.

6. The coated cutting tool according to claim 3, wherein the multi-nano-layer comprises nano-composite nano-layers alternately stacked with second nano-layers.

7. The coated cutting tool according to claim 3, wherein the multi-nano-layer comprises two or more second nano-layers between sequential nano-composite nano-layers.

8. The coated cutting tool according to claim 3, wherein the multi-nano-layer comprises 50 to 300 nano-composite nano-layers.

9. The coated cutting tool according to claim 1, wherein:
the coating further comprises at least one intermediate layer between the substrate and the multi-nano-layer; and
the at least one intermediate layer comprises one or more of a boride, carbide, nitride, or oxide of one or more elements selected from the group consisting of Ti, Zr, Hf, V, Nb, Ta, Cr, Mo, W, Al, Si, Y and Ru.

10. The coated cutting tool according to claim 9, wherein:
the at least one intermediate layer is $(Ti_aAl_bMe_{1-a-b})(C_vN_{1-v})$, wherein $0 \leq a \leq 1$, $0 \leq b \leq 0.75$, and $0 \leq v \leq 1$;
Me is a metal selected from the group consisting of Cr, Mo, V, Nb, Ta, Zr, Hf, Y, and Ru; and
a thickness of the at least one intermediate layer is from 0.5 µm to 10 µm.

11. The coated cutting tool according to claim 9, wherein:
the intermediate layer further comprises at least two sublayers differing in composition; and
a thickness of the at least two sublayers is from 1 nm to 500 nm.

12. The coated cutting tool according to claim 9, wherein:
the coating further comprises an adhesion layer between the substrate and the intermediate layer, a composition of the adhesion layer being different from a composition of the intermediate layer;
the adhesion layer comprises at least one layer of $(Me_wAl_{1-w})N$, wherein $0.5 \leq w \leq 1$;
M is titanium and/or chromium; and
a thickness of the adhesion layer is from 0.1 µm to 2 µm.

13. The coated cutting tool according to claim 1, wherein the coating comprises:
more than one multi-nano-layer and at least one auxiliary layer between the multi-nano-layers, the at least one auxiliary layer comprising:
   (a) a metallic material consisting of one or more metals selected from the group consisting of Ti, Zr, Hf, V, Nb, Ta, Cr, Mo, W, Al, Y and Ru; or
   (b) a ceramic material selected from the group consisting of:
   (b1) one or more of a boride, carbide, nitride, or oxide of one or more elements selected from the group consisting of Ti, Zr, Hf, V, Nb, Ta, Cr, Mo, W, Al, Si, Y and Ru,
   (b2) diamond,
   (b3) diamond-like-carbon, and
   (b4) BN.

14. The coated cutting tool according to claim 1, wherein an outermost layer of the coating comprises the multi-nano layer.

15. The coated cutting tool according to claim 1 further comprising a top layer, the top layer being the outermost layer of the coating and comprising:
   (a) a metallic material one or more metals selected from the group consisting of Ti, Zr, Hf, V, Nb, Ta, Cr, Mo, W, Al, Y and Ru; or
   (b) a ceramic material selected from the group consisting of:
   (b1) one or more of a boride, carbide, nitride, or oxide of one or more elements selected from the group consisting of Ti, Zr, Hf, V, Nb, Ta, Cr, Mo, W, Al, Si, Y and Ru,
   (b2) diamond,
   (b3) diamond-like-carbon, and
   (b4) BN.

16. The coated cutting tool according to claim 1, wherein:
the substrate is selected from the group consisting of high speed steel, hard metals, oxide ceramics, carbide ceramics, boride ceramics, super abrasive materials, PcBN, PCD, and cermets, and combinations thereof.

17. A method of making the coated cutting tool comprising a substrate and a coating according to claim 1, the method comprising the steps of:
   a) depositing a nano-composite nano-layer over the substrate, the nano-composite nano-layer consisting of crystalline $(Ti_xAl_yCr_z)N$ embedded in an amorphous $Si_3N_4$ matrix, wherein $0.25<x<0.75$, $0.25<y<0.75$, $0.05<z<0.2$, $0.85<x+y+z<0.97$, and $1-x-z<0.75$, wherein:
the atomic ratio of silicon is 1-x-y-z; and
a thickness of the nano-composite nano-layer is from 1 nm to 100 nm;
   b) depositing at least one second nano-layer over the nano-composite nano-layer, the second nano-layer being crystalline, having a thickness of from 1 nm to 100 nm and comprising:
   (a1) a metallic material consisting of one or more metals selected from the group consisting of Ti, Zr, Hf, V, Nb, Ta, Cr, Mo, W, Al, Y and Ru; or
   (a2) a ceramic material comprising:
   (a21) one or more of a boride, carbide, nitride, or oxide of one or more elements selected from the group consisting of Ti, Zr, Hf, V, Nb, Ta, Cr, Mo, W, Al, Si, Y and Ru,
   (a22) diamond, or
   (a23) BN; and
   c) alternatingly performing step a and step b 50 to 300 times.

18. The method according to claim 17, wherein the coating is deposited with a PVD technique at a deposition temperature of more than 500° C. under a nitrogen partial pressure of at least 0.02 mbar.

19. The method according to claim 17, further comprising one or more steps of:
   i) depositing an adhesion layer over the substrate, prior to performing step a), wherein:
      the adhesion layer comprises at least one layer of $(Me_wAl_{1-w})N$, wherein $0.5<w<1$;
      M is titanium and/or chromium; and
      a thickness of the adhesion layer is from 0.1 μm to 2 μm; and
   ii) depositing at least one intermediate layer over the adhesion layer, the intermediate layer comprising one or more of a boride, carbide, nitride, or oxide of one or more elements selected from the group consisting of Ti, Zr, Hf, V, Nb, Ta, Cr, Mo, W, Al, Si, Y and Ru.

20. The method according to claim 19, wherein:
   the at least one intermediate layer comprises $(Ti_aAl_b Me_{1-a-b})(C_vN_{1-v})$, wherein $0<a<1$, $0<b<0.75$, and $0<v<1$;
   Me is a metal selected from the group consisting of Cr, Mo, V, Nb, Ta, Zr, Hf, Y, and Ru; and
   a thickness of the intermediate layer is from 0.5 μm to 10 μm.

21. The method according to claim 17, further comprising the step of:
   d) treating the coated cutting tool in a protective atmosphere of nitrogen at a temperature of from 400° C. to 1100° C. for a duration of from 20 minutes to 180 minutes.

22. The method according to claim 17, wherein the coating comprises more than one multi-nano-layer and the method further comprises:
   e) depositing at least one auxiliary layer over the multi-nano-layer, the at least one auxiliary layer comprising:
      (e1) a metallic material consisting of one or more metals selected from the group consisting of Ti, Zr, Hf, V, Nb, Ta, Cr, Mo, W, Al, Y and Ru; or
      (e2) a ceramic material selected from the group consisting of:
         (e21) one or more of a boride, carbide, nitride, or oxide of one or more elements selected from the group consisting of Ti, Zr, Hf, V, Nb, Ta, Cr, Mo, W, Al, Si, Y and Ru,
         (e22) diamond,
         (e23) diamond-like-carbon, and
      (e24) BN;
   f) performing steps a-c; and
   g) alternatingly performing step e and step f at least one time.

* * * * *